US010325773B2

(12) United States Patent
Varadarajan et al.

(10) Patent No.: US 10,325,773 B2
(45) Date of Patent: Jun. 18, 2019

(54) CONFORMAL DEPOSITION OF SILICON CARBIDE FILMS

(71) Applicant: Novellus Systems, Inc., Fremont, CA (US)

(72) Inventors: Bhadri N. Varadarajan, Beaverton, OR (US); Bo Gong, Sherwood, OR (US); Zhe Gui, Tigard, OR (US)

(73) Assignee: Novellus Systems, Inc., Fremont, CA (US)

( * ) Notice: Subject to any disclaimer, the term of this patent is extended or adjusted under 35 U.S.C. 154(b) by 303 days.

(21) Appl. No.: 14/616,435

(22) Filed: Feb. 6, 2015

(65) Prior Publication Data

US 2015/0303056 A1 Oct. 22, 2015

Related U.S. Application Data

(63) Continuation-in-part of application No. 13/494,836, filed on Jun. 12, 2012, and a continuation-in-part of
(Continued)

(51) Int. Cl.
*H01L 21/02* (2006.01)
*C23C 16/505* (2006.01)
(Continued)

(52) U.S. Cl.
CPC ...... *H01L 21/02167* (2013.01); *C23C 16/045* (2013.01); *C23C 16/325* (2013.01);
(Continued)

(58) Field of Classification Search
CPC ...... C23C 16/325; C23C 16/40; C23C 16/401
See application file for complete search history.

(56) References Cited

U.S. PATENT DOCUMENTS

| 4,177,474 A | 12/1979 | Ovshinsky |
| 4,656,110 A | 4/1987 | Yamazaki |

(Continued)

FOREIGN PATENT DOCUMENTS

| CN | 101111930 A | 1/2008 |
| CN | 101536191 A | 9/2009 |

(Continued)

OTHER PUBLICATIONS

A.M. Wrobel & A. Walkiewicz-Pietrzykowska, "Oligomerization and Polymerization Steps in Remote Plasma Chemical Vapor Deposition of Silicon-Carbon and Silica Films from Organosilicon Sources" Chem. Mater., vol. 13 (2001), 1884-1895.*

(Continued)

*Primary Examiner* — Brigitte A Paterson
(74) *Attorney, Agent, or Firm* — Weaver Austin Villeneuve & Sampson LLP

(57) ABSTRACT

Disclosed are methods and systems for providing silicon carbide films. A layer of silicon carbide can be provided under process conditions that employ one or more silicon-containing precursors that have one or more silicon-hydrogen bonds and/or silicon-silicon bonds. The silicon-containing precursors may also have one or more silicon-oxygen bonds and/or silicon-carbon bonds. One or more radical species in a substantially low energy state can react with the silicon-containing precursors to form the silicon carbide film. The one or more radical species can be formed in a remote plasma source.

17 Claims, 5 Drawing Sheets

Related U.S. Application Data application No. 13/907,699, filed on May 31, 2013, now Pat. No. 9,234,276.

(51) Int. Cl.

| | |
|---|---|
| *C23C 16/511* | (2006.01) |
| *C23C 16/32* | (2006.01) |
| *C23C 16/452* | (2006.01) |
| *H01L 29/49* | (2006.01) |
| *H01L 21/768* | (2006.01) |
| *C23C 16/04* | (2006.01) |

(52) U.S. Cl.
CPC .......... *C23C 16/452* (2013.01); *C23C 16/505* (2013.01); *C23C 16/511* (2013.01); *H01L 21/02126* (2013.01); *H01L 21/02211* (2013.01); *H01L 21/02216* (2013.01); *H01L 21/02222* (2013.01); *H01L 21/02274* (2013.01); *H01L 21/76831* (2013.01); *H01L 21/76834* (2013.01); *H01L 29/4983* (2013.01); *H01L 29/4991* (2013.01); *H01L 21/7682* (2013.01); *H01L 2221/1047* (2013.01)

(56) References Cited

U.S. PATENT DOCUMENTS

| | | |
|---|---|---|
| 4,952,658 A | 8/1990 | Kalchauer et al. |
| 5,034,355 A | 7/1991 | Tani et al. |
| 5,108,965 A | 4/1992 | Tani et al. |
| 5,324,690 A | 6/1994 | Gelatos et al. |
| 5,447,816 A | 9/1995 | Kodama et al. |
| 5,464,699 A | 11/1995 | Baldi |
| 5,654,208 A | 8/1997 | Harris et al. |
| 5,739,579 A | 4/1998 | Chiang et al. |
| 5,807,615 A | 9/1998 | Sindzingre et al. |
| 5,958,324 A | 9/1999 | Bujalski et al. |
| 6,045,877 A | 4/2000 | Gleason et al. |
| 6,100,587 A | 8/2000 | Merchant et al. |
| 6,150,719 A | 11/2000 | Saia et al. |
| 6,159,871 A | 12/2000 | Loboda et al. |
| 6,197,688 B1 | 3/2001 | Simpson |
| 6,242,686 B1 | 6/2001 | Kishimoto et al. |
| 6,262,445 B1 * | 7/2001 | Swanson ............ H01L 21/3065 257/288 |
| 6,316,167 B1 | 11/2001 | Angelopoulos et al. |
| 6,352,945 B1 | 3/2002 | Matsuki |
| 6,383,898 B1 | 5/2002 | Kishimoto |
| 6,383,955 B1 | 5/2002 | Matsuki |
| 6,395,150 B1 | 5/2002 | Van Cleemput et al. |
| 6,399,484 B1 | 6/2002 | Yamasaki et al. |
| 6,410,419 B1 | 6/2002 | Merchant et al. |
| 6,417,092 B1 | 7/2002 | Jain et al. |
| 6,424,044 B1 | 7/2002 | Han et al. |
| 6,432,846 B1 | 8/2002 | Matsuki |
| 6,448,186 B1 | 9/2002 | Olson et al. |
| 6,455,409 B1 | 9/2002 | Subramanian et al. |
| 6,465,366 B1 | 10/2002 | Nemani et al. |
| 6,465,372 B1 | 10/2002 | Xia et al. |
| 6,506,692 B2 | 1/2003 | Andideh |
| 6,624,064 B1 | 9/2003 | Sahin et al. |
| 6,670,715 B2 | 12/2003 | Yang et al. |
| 6,764,958 B1 | 7/2004 | Nemani et al. |
| 6,767,836 B2 | 7/2004 | San et al. |
| 6,774,489 B2 | 8/2004 | Russell et al. |
| 6,790,767 B2 | 9/2004 | Lee |
| 6,790,788 B2 | 9/2004 | Li et al. |
| 6,846,391 B1 | 1/2005 | Papasouliotis et al. |
| 6,855,645 B2 | 2/2005 | Tang et al. |
| 6,875,687 B1 | 4/2005 | Weidman et al. |
| 6,881,683 B2 | 4/2005 | Matsuki et al. |
| 6,890,850 B2 | 5/2005 | Lee et al. |
| 6,919,270 B2 | 7/2005 | Satoh et al. |
| 6,930,013 B2 | 8/2005 | Choi et al. |
| 6,935,553 B2 | 8/2005 | Suga et al. |
| 6,949,450 B2 | 9/2005 | Chiang et al. |
| 6,967,405 B1 | 11/2005 | Yu et al. |
| 6,991,959 B2 | 1/2006 | Goundar et al. |
| 7,064,088 B2 | 6/2006 | Hyodo et al. |
| 7,091,137 B2 | 8/2006 | Lee et al. |
| 7,115,534 B2 | 10/2006 | Nguyen et al. |
| 7,163,889 B2 | 1/2007 | Yu et al. |
| 7,200,460 B2 | 4/2007 | Campana et al. |
| 7,239,017 B1 | 7/2007 | Yu et al. |
| 7,253,125 B1 | 8/2007 | Bandyopadhyay et al. |
| 7,256,139 B2 | 8/2007 | Moghadam et al. |
| 7,282,438 B1 | 10/2007 | Yu et al. |
| 7,381,662 B1 | 6/2008 | Niu et al. |
| 7,420,275 B1 | 9/2008 | Yu et al. |
| 7,468,290 B2 | 12/2008 | Lukas et al. |
| 7,573,061 B1 | 8/2009 | Yu et al. |
| 7,622,400 B1 | 11/2009 | Fox et al. |
| 7,662,355 B2 | 2/2010 | Kamisako et al. |
| 7,709,063 B2 | 5/2010 | Yuda et al. |
| 7,736,728 B2 | 6/2010 | Loboda et al. |
| 7,842,604 B1 | 11/2010 | Yu et al. |
| 7,915,166 B1 | 3/2011 | Yu et al. |
| 7,923,385 B2 | 4/2011 | Wu et al. |
| 7,968,436 B1 | 6/2011 | Yu et al. |
| 8,021,992 B2 | 9/2011 | Liou et al. |
| 8,053,372 B1 | 11/2011 | Greer et al. |
| 8,124,522 B1 | 2/2012 | Wu et al. |
| 8,168,268 B2 | 5/2012 | Ovshinsky |
| 8,173,537 B1 | 5/2012 | Chattopadhyay et al. |
| 8,178,168 B2 | 5/2012 | O'Neill et al. |
| 8,178,443 B2 | 5/2012 | Rangarajan et al. |
| 8,247,332 B2 | 8/2012 | Rangarajan et al. |
| 8,669,181 B1 | 3/2014 | Yu et al. |
| 8,846,525 B2 | 9/2014 | Rangarajan et al. |
| 9,234,276 B2 | 1/2016 | Varadarajan |
| 9,337,068 B2 | 5/2016 | Antonelli et al. |
| 9,371,579 B2 | 6/2016 | Varadarajan et al. |
| 2001/0021491 A1 | 9/2001 | Chen et al. |
| 2002/0016085 A1 | 2/2002 | Huang et al. |
| 2002/0019148 A1 | 2/2002 | Hawryluk et al. |
| 2002/0024117 A1 | 2/2002 | Russell et al. |
| 2002/0039625 A1 | 4/2002 | Powell et al. |
| 2002/0106891 A1 | 8/2002 | Kim et al. |
| 2002/0132101 A1 | 9/2002 | Fonash et al. |
| 2003/0001275 A1 | 1/2003 | Sambucetti et al. |
| 2003/0036215 A1 | 2/2003 | Reid |
| 2003/0049460 A1 | 3/2003 | O'Neill et al. |
| 2003/0057553 A1 | 3/2003 | DelaRosa et al. |
| 2003/0064154 A1 | 4/2003 | Laxman et al. |
| 2003/0068881 A1 | 4/2003 | Xia et al. |
| 2003/0082296 A1 | 5/2003 | Elers et al. |
| 2003/0089992 A1 | 5/2003 | Rathi et al. |
| 2003/0154141 A1 | 8/2003 | Capazario et al. |
| 2003/0162033 A1 | 8/2003 | Johnson et al. |
| 2003/0194496 A1 | 10/2003 | Xu et al. |
| 2003/0232150 A1 | 12/2003 | Arnold et al. |
| 2003/0232514 A1 | 12/2003 | Kim et al. |
| 2004/0067308 A1 | 4/2004 | Zheng et al. |
| 2004/0084680 A1 | 5/2004 | Ruelke et al. |
| 2004/0084774 A1 | 5/2004 | Li et al. |
| 2004/0089924 A1 | 5/2004 | Yuasa et al. |
| 2004/0113279 A1 | 6/2004 | Chen et al. |
| 2004/0115876 A1 | 6/2004 | Goundar et al. |
| 2004/0124531 A1 | 7/2004 | Venkatraman et al. |
| 2004/0161535 A1 | 8/2004 | Goundar et al. |
| 2004/0178169 A1 | 9/2004 | Desphande et al. |
| 2004/0194706 A1 | 10/2004 | Wang et al. |
| 2004/0207084 A1 | 10/2004 | Hedrick et al. |
| 2005/0014361 A1 | 1/2005 | Nguyen et al. |
| 2005/0042889 A1 | 2/2005 | Lee et al. |
| 2005/0100682 A1 | 5/2005 | Fukiage et al. |
| 2005/0202685 A1 | 9/2005 | Huang et al. |
| 2005/0233555 A1 | 10/2005 | Rajagopalan et al. |
| 2005/0236711 A1 | 10/2005 | Wang et al. |
| 2005/0245071 A1 | 11/2005 | Wu et al. |
| 2005/0255714 A1 | 11/2005 | Iyer et al. |
| 2005/0277302 A1 | 12/2005 | Nguyen et al. |
| 2005/0287811 A1 | 12/2005 | Inukai |
| 2006/0019486 A1 | 1/2006 | Yu et al. |

(56) References Cited

U.S. PATENT DOCUMENTS

| | | |
|---|---|---|
| 2006/0040507 A1 | 2/2006 | Mak et al. |
| 2006/0110931 A1 | 5/2006 | Fukazawa et al. |
| 2007/0004204 A1 | 1/2007 | Fukazawa et al. |
| 2007/0141812 A1 | 6/2007 | Zagwijn et al. |
| 2007/0166546 A1 | 7/2007 | Ichikawa et al. |
| 2007/0232071 A1 | 10/2007 | Balseanu et al. |
| 2007/0264839 A1 | 11/2007 | Van Gompel et al. |
| 2007/0281497 A1 | 12/2007 | Liu et al. |
| 2008/0050933 A1 | 2/2008 | Ozaki et al. |
| 2008/0063809 A1 | 3/2008 | Lee et al. |
| 2008/0064173 A1 | 3/2008 | Hung |
| 2008/0070396 A1 | 3/2008 | Budrevich et al. |
| 2008/0099754 A1 | 5/2008 | Enicks |
| 2008/0122103 A1 | 5/2008 | Bonilla et al. |
| 2008/0128907 A1 | 6/2008 | Yang et al. |
| 2008/0173984 A1 | 7/2008 | Lin et al. |
| 2008/0217746 A1 | 9/2008 | Morita et al. |
| 2008/0254641 A1 | 10/2008 | Kobayashi et al. |
| 2009/0042402 A1 | 2/2009 | Morioka |
| 2009/0082240 A1 | 3/2009 | Nukui et al. |
| 2009/0215282 A1 | 8/2009 | Moore et al. |
| 2009/0218699 A1 | 9/2009 | Torres et al. |
| 2009/0258487 A1 | 10/2009 | Lin et al. |
| 2009/0264277 A1 | 10/2009 | Raj et al. |
| 2009/0294925 A1 | 12/2009 | Lin et al. |
| 2010/0075077 A1* | 3/2010 | Bicker .................. B05D 1/62 428/34.6 |
| 2010/0081293 A1 | 4/2010 | Mallick et al. |
| 2010/0207274 A1 | 8/2010 | Hayashi et al. |
| 2010/0308463 A1 | 12/2010 | Yu et al. |
| 2011/0027957 A1 | 2/2011 | Berry |
| 2011/0045676 A1 | 2/2011 | Park et al. |
| 2011/0111590 A1 | 5/2011 | Edelstein et al. |
| 2011/0114994 A1* | 5/2011 | Mandlik .................. C23C 16/02 257/100 |
| 2011/0135557 A1 | 6/2011 | Rangarajan et al. |
| 2011/0193230 A1* | 8/2011 | Nogami .............. H01L 21/0337 257/741 |
| 2011/0236594 A1 | 9/2011 | Haverkamp et al. |
| 2012/0009802 A1 | 1/2012 | LaVoie et al. |
| 2012/0077349 A1 | 3/2012 | Li et al. |
| 2012/0142172 A1 | 6/2012 | Fox et al. |
| 2013/0075455 A1 | 3/2013 | Shimizu |
| 2013/0084711 A1 | 4/2013 | Liang et al. |
| 2013/0119406 A1 | 5/2013 | Notsu et al. |
| 2013/0129940 A1* | 5/2013 | Xiao .................. C07F 7/025 427/578 |
| 2013/0157466 A1 | 6/2013 | Fox et al. |
| 2013/0242493 A1 | 9/2013 | Shenoy et al. |
| 2013/0330932 A1 | 12/2013 | Rangarajan et al. |
| 2013/0330935 A1 | 12/2013 | Varadarajan |
| 2014/0175617 A1 | 6/2014 | Antonelli et al. |
| 2014/0356549 A1 | 12/2014 | Varadarajan |
| 2015/0118394 A1 | 4/2015 | Varadarajan et al. |
| 2016/0090649 A1 | 3/2016 | Varadarajan |
| 2016/0276140 A1 | 9/2016 | Varadarajan et al. |
| 2016/0314964 A1 | 10/2016 | Tang et al. |

FOREIGN PATENT DOCUMENTS

| | | |
|---|---|---|
| EP | 1 172 845 A2 | 1/2002 |
| EP | 1 186 685 A2 | 3/2002 |
| JP | 2001-160547 | 6/2001 |
| JP | 2002-176100 | 6/2002 |
| JP | 2002-217189 | 8/2002 |
| JP | 2004-247725 | 9/2004 |
| JP | 2007-158000 | 6/2007 |
| JP | 2008-529296 | 7/2008 |
| TW | 476807 B | 2/2002 |
| TW | 535253 B | 6/2003 |
| TW | 200405437 | 4/2004 |
| TW | 200803988 | 1/2008 |
| TW | 200839884 | 10/2008 |
| TW | 200903635 A | 1/2009 |
| TW | 200908138 | 2/2009 |
| TW | 201214563 A | 4/2012 |
| WO | WO 2007/116492 | 10/2007 |

OTHER PUBLICATIONS

Wu et al., U.S. Appl. No. 11/693,661, filed Mar. 29, 2007.
Varadarajan, Bhadri, U.S. Appl. No. 13/907,699, filed May 31, 2013.
U.S. Office Action dated Feb. 24, 2005 issued in U.S. Appl. No. 10/670,660.
U.S. Notice of Allowance dated Sep. 11, 2006 issued in U.S. Appl. No. 11/234,808.
U.S. Office Action dated May 3, 2006 issued in U.S. Appl. No. 10/915,117.
U.S. Final Office Action dated Sep. 7, 2006 issued in U.S. Appl. No. 10/915,117.
U.S. Office Action dated Dec. 11, 2006 issued in U.S. Appl. No. 10/915,117.
U.S. Notice of Allowance dated Feb. 26, 2007 issued in U.S. Appl. No. 10/915,117.
U.S. Office Action dated May 1, 2008 issued in U.S. Appl. No. 11/373,847.
U.S. Notice of Allowance and Allowed Claims dated Jul. 1, 2008 issued in U.S. Appl. No. 11/373,847.
U.S. Office Action dated Apr. 10, 2009 issued in U.S. Appl. No. 11/805,356.
U.S. Final Office Action dated Oct. 13, 2009 issued in U.S. Appl. No. 11/805,356.
U.S. Office Action dated Apr. 8, 2010 issued in U.S. Appl. No. 11/805,356.
U.S. Notice of Allowance and Allowed Claims dated Jul. 26, 2010 issued in U.S. Appl. No. 11/805,356.
U.S. Office Action dated Sep. 6, 2006 issued in U.S. Appl. No. 10/869,474.
U.S. Office Action dated Feb. 9, 2007 issued in U.S. Appl. No. 10/869,474.
U.S. Final Office Action dated Jun. 28, 2007 issued in U.S. Appl. No. 10/869,474.
U.S. Notice of Allowance dated Jul. 26, 2007 issued in U.S. Appl. No. 10/869,474.
U.S. Office Action dated Mar. 17, 2008 issued in U.S. Appl. No. 11/893,490.
U.S. Office Action dated Aug. 8, 2008 issued in U.S. Appl. No. 11/893,490.
U.S. Office Action (Ex Parte Quayle) dated Jan. 27, 2009 issued in U.S. Appl. No. 11/893,490.
U.S. Notice of Allowance dated May 4, 2009 issued in U.S. Appl. No. 11/893,490.
U.S. Office Action dated Oct. 15, 2010 issued in U.S. Appl. No. 12/497,322.
U.S. Notice of Allowance and Allowed Claims dated Mar. 11, 2011 issued in U.S. Appl. No. 12/497,322.
U.S. Office Action dated Nov. 20, 2009 issued in U.S. Appl. No. 11/710,652.
U.S. Final Office Action dated Apr. 15, 2010 issued in U.S. Appl. No. 11/710,652.
U.S. Office Action dated Aug. 5, 2010 issued in U.S. Appl. No. 11/710,652.
U.S. Notice of Allowance and Allowed Claims dated Nov. 24, 2010 issued in U.S. Appl. No. 11/710,652.
U.S. Office Action dated Jul. 9, 2013 issued in U.S. Appl. No. 11/710,652.
U.S. Notice of Allowance dated Oct. 25, 2013 issued in U.S. Appl. No. 11/710,652.
U.S. Office Action dated Aug. 28, 2009 issued in U.S. Appl. No. 11/693,661.
U.S. Office Action dated Feb. 24, 2010 issued in U.S. Appl. No. 11/693,661.
U.S. Final Office Action dated Nov. 5, 2010 issued in U.S. Appl. No. 11/693,661.

(56) References Cited

OTHER PUBLICATIONS

U.S. Office Action dated Dec. 31, 2008 issued in U.S. Appl. No. 11/693,617.
U.S. Office Action dated Oct. 7, 2009 issued in U.S. Appl. No. 11/693,617.
U.S. Office Action dated Jun. 10, 2010 issued in U.S. Appl. No. 11/693,617.
U.S. Final Office Action dated Jan. 20, 2011 issued in U.S. Appl. No. 11/693,617.
U.S. Office Action dated Sep. 16, 2011 issued in U.S. Appl. No. 11/693,617.
U.S. Notice of Allowance dated Jan. 9, 2012 issued in U.S. Appl. No. 11/693,617.
U.S. Office Action dated Jan. 12, 2011 issued in U.S. Appl. No. 12/082,496.
U.S. Final Office Action dated Aug. 4, 2011 issued in U.S. Appl. No. 12/082,496.
U.S. Notice of Allowance dated Oct. 26, 2011 issued in U.S. Appl. No. 12/082,496.
U.S. Notice of Allowance dated Apr. 10, 2012 issued in U.S. Appl. No. 12/631,691.
U.S. Office Action dated Feb. 7, 2014 issued in U.S. Appl. No. 13/967,832.
U.S. Notice of Allowance dated May 30, 2014 issued in U.S. Appl. No. 13/967,832.
U.S. Notice of Allowance dated May 5, 2014 issued in U.S. Appl. No. 13/967,832.
U.S. Office Action dated Feb. 7, 2014 issued in U.S. Appl. No. 13/494,836.
U.S. Final Office Action dated Aug. 21, 2014 issued in U.S. Appl. No. 13/494,836.
Chinese First Office Action dated Jan. 24, 2014 issued in CN Application No. 201010569747.0.
Chinese Second Office Action dated Aug. 14, 2014 issued in CN Application No. 201010569747.0.
Japanese Office Action dated Jul. 29, 2014 issued in JP Application No. 2010-256165.
Jones et al., (Nov. 30, 2001) "Silicon Containing Polymers: The Science and Technology of Their Synthesis and Applications," *Springer*, p. 705.
Lemaire, P.J., Walker, K.L., Kranz, K.S., Huff, R.G. and DiMarcello, F.V., (1990) "Diffusion of Hydrogen Through Hermetic Carbon Films on Silica Fibers," AT&T Bell Laboratories, 600 Mountain Avenue, Murray Hill, NJ 07974, *Mat. Res. Soc. Symp. Proc.* vol. 172, 12 pages, © 1990 Materials Research Society.
Maeda et al. (Sep. 1989), "A Low-Permittivity Interconnection Using an SiBN Interlayer," *IEEE Transactions on Electron Devices* 36(9).
Sugino, Takashi et al. (2001), "Synthesis of boron nitride film with low dielectric constant for its application to silicon ultralarge scale integrated semiconductors," *Diamond and Related Materials*, pp. 1275-1379, Elsevier Science B.V.
Wrobel et al., "Reactivity of Organosilicon Precursors in Remote Hydrogen Microwave Plasma Chemical Vapor Deposition of Silicon Carbide and Silicon Carbonitride Thin-Film Coatings," *Appl. Organometal. Chem.*, 2010, vol. 24, pp. 201-207.
Wu et al. (Oct. 17-19, 2006), "Ultra Low k Dielectrics Prepared by PECVD Using a Single-Precursor and Treated by UV Assisted Thermal Processing," *Advanced Metallization Conference (AMC)* 2006, pp. 1-6, San Diego, CA.
Varadarajan, Bhadri, U.S. Appl. No. 14/961,637, filed Dec. 7, 2015 entitled "Method to Obtain SIC Class of Films of Desired Composition and Film Properties.".
Tan et al., U.S. Appl. No. 14/692,627, filed Apr. 21, 2015 entitled , "Gap Fill Using Carbon-Based Films.".
U.S. Office Action dated Dec. 19, 2014 issued in U.S. Appl. No. 13/907,699.
U.S. Final Office Action dated May 14, 2015 issued in U.S. Appl. No. 13/907,699.
U.S. Advisory Action and Examiner Initiated Interview Summary dated Aug. 12, 2015 issued in U.S. Appl. No. 13/907,699.
U.S. Notice of Allowance dated Sep. 10, 2015 issued in U.S. Appl. No. 13/907,699.
U.S. Office Action dated Sep. 15, 2015 issued in U.S. Appl. No. 14/062,648.
U.S. Office Action dated Sep. 29, 2015 issued in U.S. Appl. No. 14/105,026.
U.S. Notice of Allowance dated Jan. 29, 2016 issued in U.S. Appl. No. 14/105,026.
U.S. Office Action dated May 5, 2015 issued in U.S. Appl. No. 13/494,836.
U.S. Final Office Action dated Nov. 16, 2015 issued in U.S. Appl. No. 13/494,836.
Chinese Third Office Action dated Jan. 13, 2015 issued in CN Application No. 201010569747.0.
Taiwan Notice of Allowance and Search Report dated Jul. 8, 2015 issued in Application No. TW 099140866.
Taiwan Office Action dated Jan. 14, 2016 issued in Application No. TW 104126278.
Taiwan Office Action dated Dec. 22, 2015 issued in Application No. TW 102120742.
Benilan et al., (Oct. 4, 2011) "Optimization of microwave Hydrogen plasma discharges to mimic Lyman $\alpha$(121.6 nm) solar irradiations," *EPSC-DPS2011-1317, EPSC-DPJ Joint Meeting 2011, EPSC Abstracts*, 6:2pp.
Blaszczyk-Lezak et al., (2005) "Silicon Carbonitride Films Produced by Remote Hydrogen Microwave Plasma CVD Using a (Dimethylamino)dimethylsilane Precursor," *Chemical Vapor Deposition*, 11(1):44-52.
"Development of Current Atomic Theory," Emission Spectrum of Hydrogen, [downloaded at http://chemed.chem.purdue.edu/genchem/topicreview/bp/ch6/bohr.html on Sep. 23, 2015], 7 pp.
"Dummies' Guide to Hydrogen," *Molecular Hydrogen Foundation, MHF*, [downloaded at http://www.molecularhydrogenfoundation.org/core-information/dummies-guide-to-hydrogen on Sep. 23, 2015], 2 pp.
Fozza et al., (Jan./Feb. 1998) "Vacuum ultraviolet to visible emission of some pure gases and their mixtures used for plasma processing," *J. Vac. Sci. Technol. A, American Vacuum Society*, 16(1):72-77.
Fozza et al., (Jul. 2000) "Vacuum ultraviolet to visible emission from hydrogen plasma: Effect of excitation frequency," *Journal of Applied Physics*, 88(1)20-33.
Grubbs et al. (May/Jun. 2006) "Attenuation of hydrogen radicals traveling under flowing gas conditions through tubes of different materials," *J. Vac. Sci. Technol. A*, 24(3):486-496.
Hatanaka et al., (2000) "Experiments and analyses of SiC thin film deposition from organo-silicon by a remote plasma method," *Thin Solid Films*, 368:287-291.
Holländer et al., (May 1994) "Vacuum ultraviolet emission from microwave plasmas of hydrogen and its mixtures with helium and oxygen," *J. Vac. Sci. Technol. A*, 12(3):879-882.
Huran, J., et al., (2004) "RBS study of amorphous silicon carbide films deposited by PECVD," *Czechoslovak Journal of Physics*, 54(Suppl. C):C1006-C1010.
"Radical (chemistry)" From Wikipedia, the free encyclopedia, [downloaded at http://en.wikipedia.org/wiki/Radical_(chemistry) on Sep. 23, 2015), 11 pages.
Xu, Ying-Yu, et al., (1999) "Preparation of SiC Thin Film Using Organosilicon by Remote Plasma CVD Method," *Mat. Res. Soc. Symp. Proc.*, 544:185-189.
Varadarajan et al., U.S. Appl. No. 15/169,530, filed May 31, 2016.
U.S. Notice of Allowance dated Feb. 19, 2016 issued in U.S. Appl. No. 14/062,648.
U.S. Office Action dated Mar. 10, 2016 issued in U.S. Appl. No. 13/494,836.
Varadarajan et al., U.S. Appl. No. 15/283,159, filed Sep. 30, 2016 entitled "Remote Plasma Based Deposition of Graded or Multi-layered Silicon Carbide Film.".
U.S. Office Action dated Sep. 12, 2016 issued in U.S. Appl. No. 14/692,627.

(56) References Cited

OTHER PUBLICATIONS

U.S. Final Office Action dated Jul. 11, 2016 issued in U.S. Appl. No. 13/494,836.
Chinese First Office Action dated Sep. 5, 2016 issued in Application No. CN 201410576747.1.

* cited by examiner

CONFORMAL DEPOSITION OF SILICON CARBIDE FILMS

CROSS REFERENCE TO RELATED APPLICATIONS

This application is a continuation in part of U.S. patent application Ser. No. 13/494,836, filed Jun. 12, 2012, and is also a continuation in part of U.S. patent application Ser. No. 13/907,699, filed May 31, 2013, both of which are incorporated herein by reference in their entireties.

INTRODUCTION

Field

The present disclosure relates generally to the formation of silicon carbide films.

Background

The silicon carbide (SiC) class of thin films has unique physical, chemical, and mechanical properties and is used in a variety of applications, particularly integrated circuit applications. Classes of SiC thin films include oxygen doped SiC, also known as silicon oxycarbide (SiOC), nitrogen doped SiC, also known as silicon nitricarbide (SiNC), oxygen and nitrogen doped SiC, also known as silicon oxynitricarbide (SiONC), and undoped silicon carbide.

SUMMARY OF THE INVENTION

Provided are methods and systems for preparing silicon carbide. A substantially conformal layer of silicon carbide can be provided using a process employing silicon-containing precursors that have one or more silicon-hydrogen bonds and/or silicon-silicon bonds. The silicon-containing precursors may also have one or more silicon-oxygen bonds, silicon-nitrogen bonds, and/or silicon-carbon bonds. A precursor can be made reactive by breaking the silicon-hydrogen bond(s), e.g., stripping a hydrogen atom from the precursor, or breaking the silicon-silicon bond(s) if present in the precursor, while preserving one or more of the silicon-oxygen bonds, silicon-nitrogen bonds, and/or silicon-carbon bonds in the precursor. The resulting film may contain the one or more silicon-oxygen and/or silicon-carbon bonds. The precursor may be converted to a reactive but substantially intact form by converting it to a radical or other reactive species in which a hydrogen atom or other atom is extracted. The hydrogen or other atom may be extracted by, for example, exposing the precursor to a radical species. In certain embodiments, one or more radical species in a substantially low energy state can react with the silicon-containing precursor(s) to form the silicon carbide. The one or more radical species can be formed in a remote plasma source. The silicon carbide can be used in a wide variety of applications, including but not limited to serving as liners, spacers, etch stops, copper diffusion barriers, pore sealants, and ultra low-k dielectric layers.

Certain aspects of the disclosure pertain to a method of depositing a silicon carbide film on a substrate, which method may be characterized by the following operations: (a) providing the substrate to a reaction chamber; (b) providing a silicon-containing precursor to the substrate, wherein the silicon-containing precursor has (i) one or more silicon-hydrogen bonds and/or silicon-silicon bonds, (ii) no carbon-oxygen bonds, and (iii) no carbon-nitrogen bonds; and (c) introducing from a source gas one or more radical species in a substantially low energy state to react with the silicon-containing precursor to form the silicon carbide film on the substrate under conditions that break the silicon-containing precursor's silicon-hydrogen bonds or silicon-silicon bonds but substantially preserve the silicon-containing precursor's silicon-carbon bonds. As examples, the silicon carbide film may include an oxygen doped silicon carbide, a nitrogen doped silicon carbide, or an undoped silicon carbide.

In some cases, the silicon containing precursor has no alkoxy groups (—C—O—R), where R is an organic moiety, and no amine groups (—C—NR$_1$R$_2$), where R$_1$ and R$_2$ are each independently hydrogen or an organic moiety. In certain implementations, during (b) and (c), no compound containing a carbon-oxygen bond or a carbon-nitrogen bond is provided to the substrate. Further, in certain implementations, the silicon carbide film is formed without performing atomic layer deposition.

In certain embodiments, the silicon-containing precursor is a cyclic siloxane such as heptamethylcyclotetrasiloxane and tetramethylcyclotetrasiloxane. In certain embodiments, the silicon containing precursor is a linear siloxane such as disiloxane or a trisiloxane. In certain embodiments, the silicon-containing precursor is an alkyl silane such as a disilane or a trisilane. In certain embodiments, the silicon-containing precursor is a silazane.

In certain embodiments, the radical species contains hydrogen radicals, oxygen radical, and/or nitrogen radicals. In some implementations, introducing the one or more radical species involves exposing the source gas to a remote plasma, which may be produced from an RF power source or a microwave power source.

In certain embodiments, the ratio of silicon-oxygen or silicon-nitrogen bonds to silicon-carbon bonds in the silicon carbide film is between about 3:1 and about 0.5:1. In some cases, the silicon carbide film on the substrate has a conformality of at least about 90%. In some applications, the substrate contains a transistor having a gate electrode, the method further comprising forming the silicon carbide film on one or more sidewalls of the gate electrode. In some applications, the silicon carbide film comprises an ultralow-k dielectric thin film.

Certain aspects of the disclosure pertain to an apparatus for depositing a silicon carbide film on a substrate, which apparatus may be characterized by the following features: a reaction chamber configured to hold the substrate during silicon carbide film deposition; a plasma chamber coupled to the reaction chamber and configured to generate a plasma outside the reaction chamber; two or more gas inlets coupled to the reaction chamber; and a controller. The controller may contain instructions for performing the following operations: (a) flowing a silicon-containing precursor through one of the gas inlets into the reaction chamber, wherein the silicon-containing precursor has (i) one or more silicon-hydrogen bonds and/or silicon-silicon bonds, (ii) no carbon-oxygen bonds, and (iii) no carbon-nitrogen bonds; (b) providing one or more radical species in a substantially low energy state from the plasma in the plasma chamber; and (c) flowing the one or more radical species through another one of the gas inlets into the reaction chamber to react with the silicon-containing precursor to form the silicon carbide film on the substrate.

In some designs, the apparatus has a distance between the reaction chamber and the plasma chamber is between about 1 cm and about 30 cm. In various implementations, the plasma chamber has an RF power source or microwave power source.

In certain embodiments, the controller further includes instructions for providing no compound containing a carbon-oxygen bond or a carbon-nitrogen bond during (a) through (c). In certain embodiments, the controller instructions do not contain instructions for depositing the silicon carbide film using atomic layer deposition.

In some implementations, the silicon containing precursor has no alkoxy groups (—C—O—R), where R is an organic moiety, and no amine groups (—C—NR$_1$R$_2$), where R$_1$ and R$_2$ are each independently hydrogen or an organic moiety. In some applications, the silicon-containing precursor is a siloxane. In some implementations, the silicon-containing precursor is an alkyl silane. In some implementations, the silicon-containing precursor is a silazane.

In some apparatus, the one or more radical species are produced from a gas selected from the group consisting of hydrogen, nitrogen, and ammonia. As an example, the one or more radical species is hydrogen atoms. In some applications, the ratio of silicon-oxygen bonds or silicon-nitrogen bonds to silicon-carbon bonds in the silicon carbide film is between about 3:1 and about 0.5:1. In some applications, the silicon carbide film is an ultralow-k dielectric thin film.

In certain embodiments, the controller is configured to maintain the reaction chamber at a temperature between about 250° C. and about 400° C. In certain embodiments, the controller is configured to maintain the reaction chamber at a pressure between about 0.2 Torr and about 40 Torr.

These and other embodiments are described further below with reference to the figures.

DETAILED DESCRIPTION

Figure 1A:
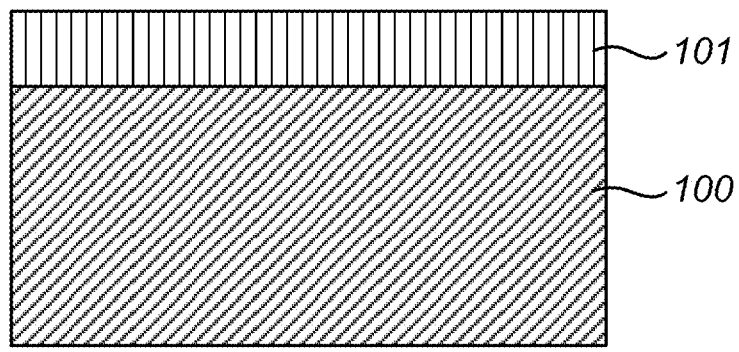
FIG. 1A illustrates a cross-section of an example of an SiC film deposited over a substrate.

The following disclosure presents various details to help explain relevant concepts, which may be practiced without some or all of these details. While some concepts will be described in conjunction with the specific embodiments, it will be understood that these embodiments are not intended to be limiting. In some instances, well known process operations, structures, and other features are not described in detail in order to facilitate understanding the described concepts.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

Introduction

Manufacture of semiconductor devices typically involves depositing one or more thin films on a substrate in an integrated circuit fabrication process. In some aspects of the fabrication process, classes of thin films such as SiC, SiON, SiONC, and SiCN are deposited using atomic layer deposition (ALD), chemical vapor deposition (CVD), plasma-enhanced chemical vapor deposition (PECVD), or any other suitable deposition method. As used herein, the term silicon carbide includes doped silicon carbides such as oxygen doped silicon carbide, nitrogen doped silicon carbide, and nitrogen and oxygen doped silicon carbide. A doped silicon carbide may have a wide range of dopant concentrations. For many, doped silicon carbides have at most about 50% atomic of dopant atoms, whether those atoms are oxygen, nitrogen, or atoms of another element. The doping level provides desired film properties. In one example, the process can make SiOC films with about 10-15% atomic carbon and about 40% atomic oxygen. In another example, the film contains about 30-35% atomic carbon and about 25-30% atomic oxygen. Of course, the silicon carbide film's electrical properties will differ. Typically, for good electrical properties, the carbon content is relatively low.

Precursor molecules for depositing SiC include silicon-containing molecules having silicon-hydrogen (Si—H) bonds and/or silicon-silicon (Si—Si) bonds bonds, and silicon-carbon (Si—C) bonds. Precursor molecules for depositing SiOC include silicon-containing molecules having silicon-hydrogen (Si—H) bonds and/or silicon-silicon (Si—Si) bonds, and silicon-oxygen (Si—O) bonds, and/or silicon-carbon (Si—C) bonds. Precursor molecules for depositing SiNC include silicon-containing molecules having silicon-hydrogen (Si—H) bonds and/or silicon-silicon (Si—Si) bonds, and silicon-nitrogen (Si—N) bonds, and/or silicon-carbon (Si—C) bonds. Precursor molecules for depositing SiONC include silicon-containing molecules having silicon-hydrogen (Si—H) bonds, and/or silicon-silicon (Si—Si) bonds, and silicon-nitrogen (Si—N) bonds, silicon-oxygen (Si—O) bonds, and/or silicon-carbon (Si—C) bonds. Current PECVD processes may use in situ plasma processing in which a plasma is provided directly adjacent to a processed substrate.

It has been found that depositing high-quality silicon carbide thin films can have certain challenges such as providing films with excellent step coverage, low dielectric constants, high breakdown voltages, low leakage currents, high porosity, and/or coverage over exposed metal surfaces without oxidizing the metal surfaces.

While this disclosure is not limited by any particular theory, it is believed that the plasma conditions in typical PECVD processes fragment the silicon-containing precursor molecules in a manner that produces undesirable effects. For example, PECVD may break Si—O and/or Si—C bonds in the precursor molecules to produce highly reactive radicals or other fragment types having high sticking coefficients.

The fragments and resulting silicon carbide film can include silicon, carbon, and/or oxygen atoms with bonds that are "dangling," meaning that silicon, carbon, and/or oxygen atoms have reactive unpaired valence electrons. High sticking coefficients of the precursor molecules and their fragments can deposit silicon carbide films with poor step coverage, as reactive precursor fragments may disproportionately stick to the upper regions of sidewalls and other structures in recessed features.

The dangling bonds can produce silanol groups (Si—OH) in a deposited SiOC or SiONC film. As a result, the films may have detrimentally high dielectric constants. Film quality may also suffer because the direct plasma conditions tend to extract carbon out of the deposited film.

Furthermore, the dangling bonds can produce increase silicon-hydrogen bonding (Si—H) in deposited silicon carbide films. Broken bonds of Si—C can be replaced with Si—H under direct plasma deposition conditions. The presence of Si—H bonds in silicon carbide films can produce films with poor electrical properties. For example, the presence of Si—H bonds can reduce breakdown voltages and can increase leakage currents because the Si—H bonds provide a leakage path for electrons.

Further, the dangling bonds can lead to uncontrolled chemical or morphological structures in the silicon carbide films. In some cases, such structures are dense filaments having low or no porosity, such that the film has an unacceptably high dielectric constant. The lack of porosity can be the result of the direct plasma conditions breaking Si—C and/or Si—O bonds in cyclic siloxanes that would otherwise provide porosity in an ultralow-k dielectric material.

Direct plasma conditions sometimes employed in PECVD can lead to directionality in the deposition because the energy to break up the precursor molecules can be a low frequency which creates a lot of ion bombardment at the surface. The directional deposition can also lead to deposition of silicon carbide films with poor step coverage. A direct plasma is a plasma in which the plasma (electrons and positive ions at an appropriate concentration) reside in close proximity to the substrate surface during deposition, sometimes separated from the substrate surface by only a plasma sheath.

Typical PECVD processes are sometimes inappropriate for depositing silicon carbide films over exposed copper or other metal surfaces because such processes can oxidize metal. The PECVD process may use oxidants such as oxygen ($O_2$), ozone ($O_3$), carbon dioxide ($CO_2$), or other oxidizing species to form an oxygen doped silicon carbide such as SiOC.

Environment at the Substrate Surface During Deposition

FIG. 1A illustrates a cross-section of a structure produced having a silicon carbide film deposited over a substrate. The film 101 can be formed under process conditions producing a relatively mild environment adjacent to the substrate 100. The substrate 100 can be any wafer, semiconductor wafer, partially fabricated integrated circuit, printed circuit board, display screen, or other appropriate work piece. The process for depositing the silicon carbide film 101 can include one or more silicon-containing precursors having one or more Si—H bonds and/or one or more Si—Si bonds, along with other bonds such as silicon-carbon bonds, silicon-oxygen bonds, and/or silicon-nitrogen bonds, depending on the type of doped structure to be produced. In certain embodiments, the precursors do not include oxygen-carbon bonds or nitrogen-carbon bonds. As an example, the precursors do not include alkoxy or amine groups.

Figure 1B:
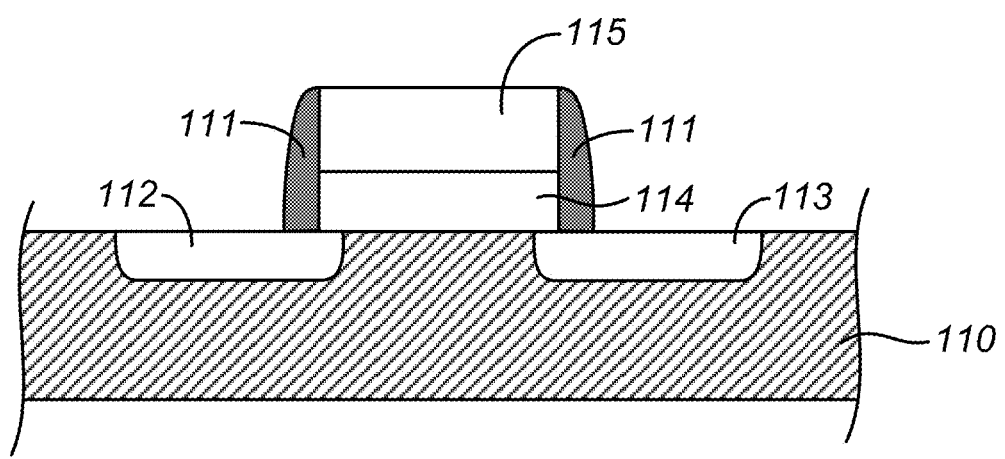
FIG. 1B illustrates SiC vertical structures on the sidewalls of a gate electrode structure of a transistor.
Figure 1C:
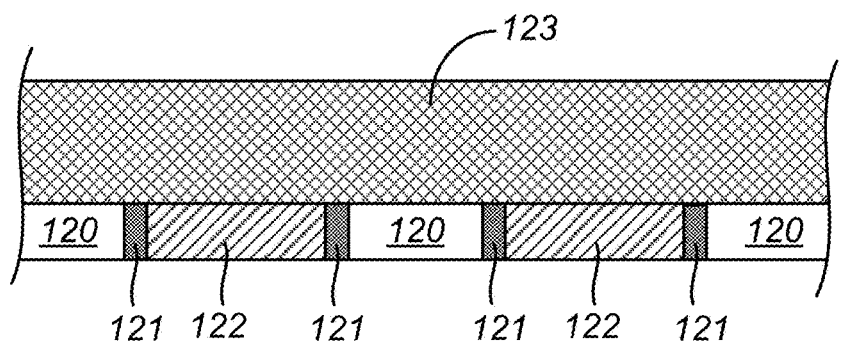
FIG. 1C illustrates SiC vertical structures on exposed sidewalls of copper lines in an air gap type metallization layer.
Figure 1D:
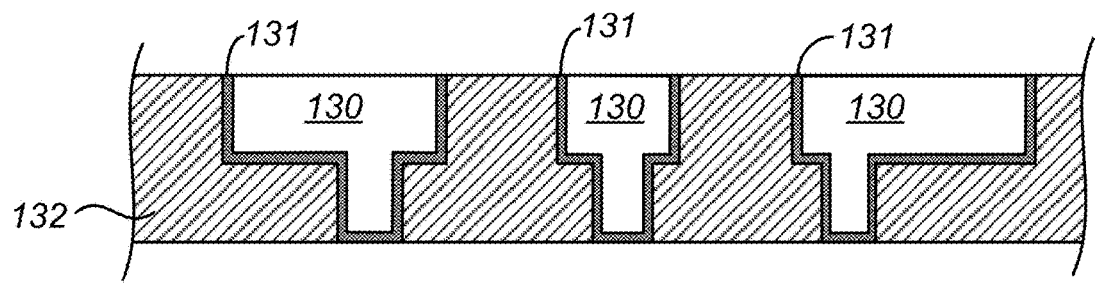
FIG. 1D illustrates SiC pore sealants for porous dielectric materials.

Certain applications employing silicon carbide films are depicted in FIGS. 1B-1D. In some embodiments, the silicon-containing precursors can include silicon-oxygen containing precursors, silicon-nitrogen containing precursors, and/or silicon-carbon containing precursors. The silicon-oxygen containing precursors can include one or more Si—O bonds, the silicon-nitrogen containing precursors can include one or more Si—N bonds, and the silicon-carbon containing precursors can include one or more Si—C bonds. In some embodiments, for example, the silicon-containing precursors can include a single reactant A with Si—O and Si—C bonds, or Si—N and Si—C bonds. In some embodiments, the silicon-containing precursors can include a reactant B with Si—O bonds or Si—N bonds, and a reactant C with Si—C bonds. It will be understood that any number of suitable reactants may be employed in the scope of this present disclosure. The chemical structures of exemplary silicon-containing precursors are discussed in further detail below.

The silicon-containing precursors include one or more Si—H bonds and/or one or more Si—Si bonds. During the deposition process, the Si—H bonds and/or Si—Si bonds are broken and serve as reactive sites for forming bonds between the silicon-containing precursors in the deposited silicon carbide film 101. The broken bonds can also serve as sites for cross-linking during thermal processing conducted during or after deposition. Bonding at the reactive sites and cross-linking can form a primary backbone or matrix collectively in the resulting silicon carbide film 101.

In some embodiments, the process conditions can substantially preserve Si—C and, if present, Si—O and Si—N bonds in the as-deposited layer of silicon carbide film 101. Accordingly, the reaction conditions adjacent to the substrate 100 provide for the breaking of Si—H and/or Si—Si bonds, e.g., extracting hydrogen from the broken Si—H bonds, but the reaction conditions do not provide for extracting oxygen from Si—O bonds, nitrogen from Si—N bonds, or carbon from Si—C bonds. Generally, the described reaction conditions exist at the exposed face of the work piece (the face where the silicon carbide film is deposited). They may further exist at some distance above the work piece, e.g., about 0.5 micrometers to about 150 millimeters above the work piece. In effect, activation of the precursor can happen in the gas phase at a substantial distance above the work piece. Typically, the pertinent reaction conditions will be uniform or substantially uniform over the entire exposed face of the substrate, although certain applications may permit some variation.

In addition to silicon-containing precursors, the environment adjacent the work piece can include one or more radical species, preferably in a substantially low energy state. An example of such species includes hydrogen atom radicals. In some embodiments, all, substantially all, or a substantial fraction of the hydrogen atom radicals can be in the ground state, e.g., at least about 90% or 95% of the hydrogen atom radicals adjacent the work piece are in the ground state. In certain embodiments, hydrogen is provided in a carrier such helium. As an example, hydrogen gas may be provided in a helium carrier at a concentration of about 1-10% hydrogen. Pressure, fraction of carrier gas such as helium, and other process conditions are chosen so that the hydrogen atoms encounter the substrate as radicals in a low energy state without recombining.

As explained elsewhere, hydrogen gas may be supplied into a remote plasma source to generate hydrogen radicals. Once generated, the hydrogen radicals may be in an excited energy state. For example, hydrogen in an excited energy state can have an energy of at least 10.2 eV (first excited state). Excited hydrogen radicals may cause unselective decomposition of the silicon-containing precursor. For example, hydrogen radicals in an excited state can easily break Si—H, Si—Si, Si—N, Si—O, and Si—C bonds, which can alter the composition or physical or electrical characteristics of the silicon carbide film. In some implementations, when the excited hydrogen radicals lose their energy, or relax, the excited hydrogen radical may become a substantially low energy state hydrogen radical or a ground state hydrogen radical. Hydrogen radicals in a substantially low energy state or ground state can be capable of selectively breaking Si—H and Si—Si bonds while generally preserving Si—O, Si—N, and Si—C bonds. In some implementations, process conditions may be provided so that excited hydrogen radicals lose energy or relax to form substantially low energy state or ground state hydrogen radicals. For example, the remote plasma source or associated components may be designed so that a residence time of hydrogen radicals diffusing from the remote plasma source to the substrate is greater than the energetic relaxation time of an excited hydrogen radical. The energetic relaxation time for an excited hydrogen radical can be about equal to or less than $1 \times 10^{-3}$ seconds.

A state in which a substantial fraction of hydrogen atom radicals are in the ground state can be achieved by various techniques. Some apparatus, such as described below, are designed to achieve this state. Apparatus features and process control features can be tested and tuned to produce a mild state in which a substantial fraction of the hydrogen atom radicals are in the ground state. For example, an apparatus may be operated and tested for charged particles downstream of the plasma source; i.e., near the substrate. The process and apparatus may be tuned until substantially no charged species exist near the substrate. Additionally, apparatus and process features may be tuned to a configuration where they begin to produce a high quality silicon carbide film from a standard precursor such as trimethylsilane. The relatively mild conditions that support such film deposition are chosen.

Other examples of radical species include oxygen-containing species such as elemental oxygen radicals (atomic or biatomic), nitrogen-containing species such as elemental nitrogen radicals (atomic or biatomic), and N—H containing radicals such as ammonia radicals, where nitrogen is optionally incorporated into the film. The aforementioned radical species may be produced from a gas that includes hydrogen, nitrogen, N—H containing species, or mixtures thereof. In some embodiments, essentially all atoms of the deposited film are provided by the precursor molecules. In such cases, the low energy radicals used to drive the deposition reaction may be exclusively hydrogen or other species that does not substantially contribute to the mass of the deposited layer. In some embodiments, as discussed in further detail below, the radical species can be produced by a remote plasma source. In some embodiments, radicals of higher energy state or even ions can potentially be present near the wafer plane.

In some embodiments, the process conditions employ radical species in a substantially low energy state sufficient to break Si—H bonds and/or Si—Si bonds while substantially preserving Si—O, Si—N, and Si—C bonds. Such process conditions may not have substantial amounts of ions, electrons, or radical species in high energy states such as states above the ground state. In some embodiments, the concentration of ions in the region adjacent the film is no greater than about $10^7/cm^3$. The presence of substantial amounts of ions or high energy radicals may tend to break Si—O, Si—N, and Si—C bonds, which can produce films with undesirable electrical properties (e.g., high dielectric constants and/or low breakdown voltages) and poor conformality. It is believed that an excessively reactive environment produces reactive precursor fragments that have high sticking coefficients (representing a propensity to chemically or physically stick to work piece sidewalls), resulting in poor conformality.

The silicon-containing precursors are typically delivered with other species, notably carrier gas, in the environment adjacent to the substrate 100. In some implementations, the silicon-containing precursors are present with the radical species and other species, including other reactive species and/or carrier gases. In some embodiments, the silicon-containing precursors may be introduced as a mixture. Upstream from the deposition reaction surface, the silicon-containing precursors can be mixed with an inert carrier gas. Example inert carrier gases include, but are not limited to, argon (Ar) and helium (He). In addition, the silicon-containing precursors can be introduced in a mixture having major and minor species, with the minor species containing some element or structural feature (e.g., a ring structure, a cage structure, an unsaturated bond, etc.) that is present in the silicon carbide film 101 at a relatively low concentration. The multiple precursors may be present in equimolar or relatively similar proportions as appropriate to form the primary backbone or matrix in the resulting silicon carbide film 101. In other embodiments, the relative amounts of the different precursors are substantially skewed from equimolarity.

In some embodiments, one or more silicon-containing precursors provide essentially all of the mass of the deposited silicon carbide film, with small amounts of hydrogen or other element from a remote plasma providing less than about 5% atomic or less than about 2% atomic of the film mass. In some embodiments, only the radical species and one or more silicon-containing precursors contribute to the composition of the deposited silicon carbide film. In other embodiments, the deposition reaction includes a co-reactant other than one or more silicon-containing precursors and the radical species. Examples of such co-reactants include carbon dioxide ($CO_2$), carbon monoxide (CO), water ($H_2O$), methanol ($CH_3OH$), oxygen ($O_2$), ozone ($O_3$), nitrogen ($N_2$), nitrous oxide ($N_2O$), ammonia ($NH_3$), methane ($CH_4$), ethane ($C_2H_6$), acetylene ($C_2H_2$), ethylene ($C_2H_4$), diborane, and combinations thereof. Such materials may be used as nitriding agents, oxidizers, reductants, etc. In some cases, they can be used to tune the amount of carbon in the deposited film by removing a fraction of the carbon provided with the silicon-containing precursor. In some implementations employing a non-hydrogen co-reactant, the co-reactant is introduced to the reactor via the same flow path as the silicon-containing precursor; e.g., a path including a showerhead, typically without direct exposure to plasma. In some embodiments, oxygen and/or carbon dioxide is introduced with the precursor to alter the composition of the silicon carbide film by removing carbon from the film or precursor during deposition. In some implementations employing a non-hydrogen co-reactant, the co-reactant is introduced to the reactor via the same flow path as the hydrogen, such that the co-reactant is at least partially converted to radicals and/or ions. In such implementations, the hydrogen radicals and the co-reactant radicals both react with the silicon-containing precursor(s) to produce the deposited silicon carbide film.

In certain embodiments where co-reactants are used and they are introduced to the chamber with the species being converted to radicals (e.g., hydrogen), they are provided to reactor in relatively small amounts in comparison to the other gases in the reactor, including the source of radicals (e.g., hydrogen) any carrier gas(es) such as helium. For example, the co-reactant may be present in the process gases at about 0.05% or less by mass, or at about 0.01% or less by mass, or at about 0.001% or less by mass. For example, a reactant mixture (that goes into the plasma source) may be about 10 L/m He, about 200-500 sccm H2, and about 1-5 sccm oxygen. When the co-reactants are introduced to the chamber along with the silicon-containing precursor (e.g., through a showerhead), they may be present at a higher concentration; for example about 2% or less or about 0.1% or less. When the co-reactant is a relatively weak reactant (e.g., a weak oxidant such as carbon dioxide), it may be present at even higher concentrations, such as about 10% or less or about 4% or less.

The temperature in the environment adjacent to the substrate 100 can be any suitable temperature facilitating the deposition reaction, but sometimes limited by the application of the device containing the silicon carbide film 101. The temperature in the environment adjacent to the substrate 100 can be largely controlled by the temperature of a pedestal on which a substrate 100 is supported during deposition of the silicon carbide film 101. In some embodiments, the operating temperature can be between about 50° C. and about 500° C. For example, the operating temperature can be between about 200° C. and about 400° C. in many integrated circuit applications. In some embodiments, increasing the temperature can lead to increased cross-linking on the substrate surface.

The pressure in the environment adjacent to the substrate 100 can be any suitable pressure to produce reactive radicals in a process chamber. In some embodiments, the pressure can be about 35 Torr or lower. For example, the pressure can be between about 10 Torr and about 20 Torr, such as in embodiments implementing a microwave generated plasma. In other examples, the pressure can be less than about 10 Torr, or between about 0.2 Torr and about 8 Torr, such as in embodiments implementing a radiofrequency (RF) generated plasma.

FIGS. 1B-1D illustrate cross-sections of structures containing silicon carbide films in a variety of applications. FIG. 1B illustrates silicon carbide vertical structures on the sidewalls of a gate electrode structure of a transistor. FIG. 1C illustrates silicon carbide vertical structures on exposed sidewalls of copper lines in an air gap type metallization layer. FIG. 1D illustrates silicon carbide pore sealants for porous dielectric materials. Each of these applications is discussed in further detail below.

Chemical Structure of Precursors

As discussed, the precursors employed in forming silicon carbide films can include silicon-containing precursors, with at least some of the silicon-containing precursors having at least one Si—H and/or at least one Si—Si bond. In certain embodiments, the silicon-containing precursor has at most one hydrogen atom on every silicon atom. Thus, for example, a precursor having one silicon atom has at most one hydrogen atom bonded to the silicon atom; a precursor having two silicon atoms has one hydrogen atom bonded to one silicon atom and optionally another hydrogen atom bonded to the second silicon atom; a precursor having three silicon atoms has at least one hydrogen atom bonded to one silicon atom and optionally one or two more hydrogen atoms bonded to one or two of the remaining silicon atoms, and so on. In addition, the silicon-containing precursors may include at least one Si—O bond, at least one Si—N bond, and/or at least one Si—C bond. While any number of appropriate precursors can be used in forming silicon carbide films, at least some of the precursors will include silicon-containing precursors with at least one Si—H bond or Si—Si bond, and optionally at least one Si—O bond, Si—N bond, and/or Si—C bond. In various implementations, the silicon-containing precursor(s) contain no O—C or N—C bonds; e.g., the precursor(s) contain no alkoxy (—O—R), where R is an organic group such as a hydrocarbon group, or amine (—$NR_1R_2$) groups, wherein $R_1$ and $R_2$ are independently hydrogen or organic groups. It is believed that such groups may impart high sticking coefficients to the precursors or fragments on which they reside. In certain embodiments, no precursor or other compound delivered to the substrate during silicon carbide formation contains an alkoxy or amine group.

In certain embodiments, at least some of the carbon provided for the silicon carbide film is provided by one or more hydrocarbon moieties on the silicon-containing precursor. Such moieties may be from alkyl groups, alkene groups, alkyne groups, aryl groups, and the like. In certain embodiments, the hydrocarbon group has a single carbon atom to minimize steric hindrance of the Si—H and/or Si—Si bond breaking reaction during deposition. However, the precursors are not limited to single-carbon groups; higher numbers of carbon atoms may be used such as 2, 3, 4, 5, or 6 carbon atoms. In certain embodiments, the hydrocarbon group is linear. In certain embodiments, the hydrocarbon group is cyclic.

In some embodiments, the silicon-containing precursors fall into one of three or more chemical classes, any of which may be present alone as the sole precursor or in combination with other types of precursors. It will be understood that other chemical classes of silicon-containing precursors may be employed and that the silicon-containing precursors are not limited to the chemical classes discussed below.

First, the silicon-containing precursor can be a siloxane. In some embodiments, the siloxane may be cylic. Cyclic siloxanes may include cyclotetrasiloxanes, such as 2,4,6,8-tetramethylcyclotetrasiloxane (TMCTS) and heptamethylcyclotetrasiloxane (HMCTS). Other cyclic siloxanes can also include but are not limited to cyclotrisiloxanes and cyclopentasiloxanes. Embodiments using cyclic siloxanes are ring structures that can introduce porosity into a silicon carbide film, with the size of the pores corresponding to the radius of the ring. For example, a cyclotetrasiloxane ring can have a radius of about 6.7 Å.

Figure 2:
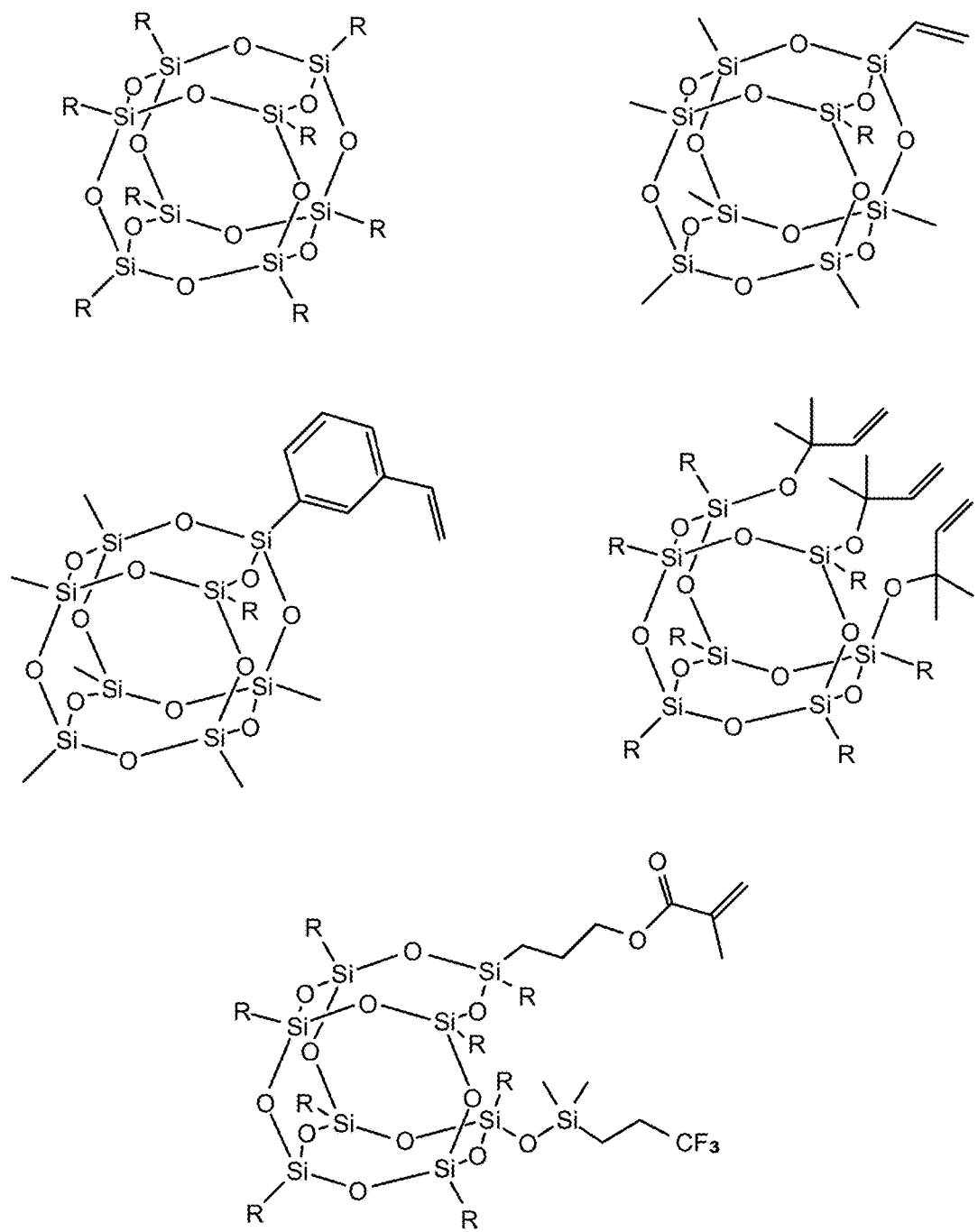
FIG. 2 illustrates examples of representative caged siloxane precursors.

In some embodiments, the siloxane may have a three-dimensional or caged structure. FIG. 2 illustrates examples of representative caged siloxane precursors. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein for all purposes. Like the cyclic siloxanes, the caged siloxane can introduce porosity into a silicon carbide film. In some embodiments, the porosity scale is mesoporous.

In some embodiments, the siloxane may be linear. Examples of suitable linear siloxanes include but are not limited to disilanes, such as pentamethyldisiloxane (PMDSO) and tetramethyldisiloxane (TMDSO), and trisiloxanes such as hexamethyltrisiloxane, heptamethyltrisiloxane.

Second, the silicon-containing precursor can be an alkyl silane or other hydrocarbon-substituted silane. The alkyl silanes include a central silicon atom with one or more alkyl groups bonded to it as well as one or more hydrogen atoms bonded to it. In certain embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3MS), triethylsilane, pentamethyl disilamethane (($CH_3$)$_2$Si—$CH_2$—Si($CH_3$)$_3$), and dimethylsilane (2MS).

Additionally, disilanes, trisilanes, or other higher silanes may be used in place of monosilanes. In some embodiments, one of the silicon atoms can have a carbon-containing or hydrocarbon group attached to it, and one of the silicon atoms can have a hydrogen atom attached to it.

Third, the silicon-containing precursor can be a nitrogen-containing compound such as a silicon-nitrogen hydride (e.g., a silazane). Generally, such compounds contain carbon, but only bonded to silicon atoms, and not to nitrogen atoms. In certain embodiments, the nitrogen-containing compound does not have any carbon-nitrogen bonds. In certain embodiments, the nitrogen-containing compound does not have any amine moieties (—C—$NR_1R_2$), where $R_1$ and $R_2$ are the same or different groups such hydrogen atoms and hydrocarbon groups such as alkyl groups, alkene groups, or alkyne groups. Examples of suitable silicon-nitrogen precursors include various silazanes such as cyclic and linear silazanes containing one or more hydrocarbon moieties bonded to one or more silicon atoms and one or more hydrogen atoms bonded to one or more silicon atoms. Examples of silazanes include methyl-substituted disilazanes and trisilazanes, such as tetramethyldisilazane and hexamethyl trisilazane.

In depositing silicon carbide, multiple silicon-containing precursors can be present in the process gas. For example, a siloxane and an alkyl silane may be used together, or a siloxane and a disilazane may be used together. The relative proportions of the individual precursors can be chosen based on the chemical structures of precursors chosen and the application of the resulting silicon carbide film. For example, the amount of siloxane can be greater than the amount of silane in molar percentages to produce a porous film as discussed in more detail below.

For depositing oxygen doped silicon carbide (SiOC) films, examples of suitable precursors include cyclic siloxanes such as cyclotetrasiloxanes such as heptamethylcyclotetrasiloxane (HMCTS) and tetramethylcyclotetrasiloxane. Other cyclic siloxanes can also include but are not limited to cyclotrisiloxanes and cyclopentasiloxanes. For depositing oxygen doped silicon carbide films, other examples of suitable precursors include linear siloxanes such as, but not limited to, disiloxanes, such as pentamethyldisiloxane (PMDSO), tetramethyldisiloxane (TMDSO), hexamethyl trisiloxane, and heptamethyl trisiloxane.

For undoped silicon carbide, examples of suitable precursors include monosilanes substituted with one or more alkyl, alkene, and/or alkyne groups containing, e.g., 1-5 carbon atoms. Examples include but are not limited to trimethylsilane (3MS), dimethylsilane (2MS), triethylsilane (TES), and pentamethyldisilamethane.

Additionally, disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS).

Other types of alkyl silanes can include alkylcarbosilanes, which can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE).

For depositing nitrogen doped silicon carbide (SiNC) films, examples of suitable precursors include, e.g., alkyldisilazanes and possibly compounds including amino (—NH2) and alkyl groups separately bonded to one or more silicon atoms. Alkyldisilazanes include silizanes and alkyl groups bonded to two silicon atoms. An example includes 1,1,3,3-tetramethyldisilazane (TMDSN).

As explained, silicon-containing precursors are chosen to provide highly conformal silicon carbide films. It is believed that silicon-containing precursors having low sticking coefficients are capable of producing highly conformal films. "Sticking coefficient" is a term used to describe the ratio of the number of adsorbate species (e.g., fragments or molecules) that adsorb/stick to a surface compared to the total number of species that impinge upon that surface during the same period of time. The symbol $S_c$ is sometimes used to refer to the sticking coefficient. The value of $S_c$ is between 0 (meaning that none of the species stick) and 1 (meaning that all of the impinging species stick). Various factors affect the sticking coefficient including the type of impinging species, surface temperature, surface coverage, structural details of the surface, and the kinetic energy of the impinging species. Certain species are inherently more "sticky" than others, making them more likely to adsorb onto a surface each time the specie impinges on the surface. These more sticky species have greater sticking coefficients (all other factors being equal), and are more likely to adsorb near the entrance of a recessed feature compared to less sticky species having lower sticking coefficients. In some cases, the sticking coefficient of the precursors (at the relevant deposition conditions) may be about 0.05 or less, for example about 0.001 or less.

Structure and Properties of the Deposited Film

The deposited film will include silicon, carbon, and in some cases oxygen, nitrogen, and/or one or more other elements. In some embodiments, the atomic concentration of silicon is between about 15% and 45% (or about 25% to 40%), the atomic concentration of carbon is between about 10% and 50%, the atomic concentration of oxygen is between about 0% and 45%, and the atomic concentration of nitrogen is between about 0% and 45%. In one example, the atomic concentration of silicon is about 30%, the atomic concentration of oxygen is about 25%, and the atomic concentration of carbon is about 45%. In another example, the atomic concentration of silicon is about 30%, the atomic concentration of oxygen is about 45%, and the atomic concentration of carbon is about 25%. In another example, the film contains about 10-15% carbon and about 30-40% oxygen, both on an atomic basis. In all cases, the film contains some hydrogen. It will be understood that the relative atomic concentrations can vary depending on the choice of the precursor. The silicon atoms will form bonds with carbon and optionally nitrogen and/or oxygen atoms. In some embodiments, the deposited film contains more Si—O bonds than Si—C bonds. This can provide a relatively porous film with a lower dielectric constant. In some examples, the deposited film contains a ratio of Si—O bonds to Si—C bonds that is between about 0.5:1 and 3:1. In some embodiments, the deposited film contains more Si—N bonds than Si—C bonds. In some examples, the deposited film contains a ratio of Si—N bonds to Si—C bonds that is between about 0.5:1 and 3:1. In certain embodiments, the film density is between about 2 and 2.7 g/cm$^3$.

In some embodiments, the internal structure of the precursor is maintained in the deposited film. This structure may preserve all or most of the Si—C, and Si—O and/or Si—N bonds, if present, in the precursor, while linking or cross-linking individual precursor moieties through bonds at locations where Si—H bonds and/or Si—Si bonds existed in the precursor molecules and/or through additional condensation reactions on the growing surface if sufficient thermal energy is provided.

The process conditions described earlier herein can provide a film structure that is highly conformal. The relatively mild process conditions can minimize the degree of ion bombardment at the surface of the substrate so that the deposition lacks directionality. Moreover, the relatively mild process conditions can reduce the number of radicals with high sticking coefficients that would have a tendency to stick to the sidewalls of previously deposited layers or films. In certain embodiments, for an aspect ratio of about 2:1 to 10:1, the silicon carbide film may be deposited with a conformality of between about 25% and 100%, more typically between about 50% and 100%, and even more typically between about 80% and 100%. Conformality may be calculated by comparing the average thickness of a deposited film on a bottom, sidewall, or top of a feature to the average thickness of a deposited film on a bottom, sidewall, or top of a feature. For example, conformality may be calculated by dividing the average thickness of the deposited film on the sidewall by the average thickness of the deposited film at the top of the feature and multiplying it by 100 to obtain a percentage. For certain applications, a conformality of between about 85% and 95% is sufficient. In some examples depositing silicon carbide on features having an aspect ratio of between about 2:1 and about 4:1, the conformality is at least about 90%. Certain BEOL (back end of line) processes fall into this category. In some examples depositing silicon carbide on features having an aspect ratio of between about 4:1 and about 6:1, the conformality is at least about 80%. Certain spacer deposition processes fall into this category. In some examples depositing silicon carbide on features having an aspect ratio of between about 7:1 and about 10:1 (and even higher), the conformality is at least about 90%. Certain DRAM (dynamic random access memory) fabrication processes fall into this category.

The process conditions can also provide a film structure with a high breakdown voltage and a low leakage current. By introducing a limited amount of oxygen or nitrogen into a SiC class of material, leakage paths provided by Si—H bonds and/or Si—CH$_2$—Si bonds may be blocked by oxygen or nitrogen. The mode of conduction may be different in Si—O and Si—N at low fields. This can provide improved electrical properties while maintaining a relatively low dielectric constant. In various embodiments, the film has an effective dielectric constant of about 5 or lower, or about 4.0 or lower, and in some cases about 3.5 or lower, and some cases about 3.0 or lower, and in still other implementations about 2.5 or lower. The effective dielectric constant can depend on the bonding and density. (In certain embodiments, SiOC films are made with a dielectric constant of 6 or greater, particularly when the carbon content is relatively high. If leakage current is an important consideration, SiOC needs to be <5. The lower you go, the worse will be its hermetic and barrier and thermal resistance properties. In some embodiments, where applications demand low hermeticity and diffusion limits, excellent etch resistance, thermal stability etc., the silicon carbide film may be made dense and highly cross-linked. This can be accomplished by, for example, a) depositing the film at a relatively high temperature, and/or b) providing a relatively high radicals:precursor ratio. In some embodiments, the silicon carbide film can be relatively thin and yet serve as an effective hermetic or diffusion barrier.

In some embodiments, the deposited film can be porous. As discussed earlier herein, the silicon-containing precursors can include cyclic siloxanes and caged siloxanes. These precursors, and others that have significant interior open space, can introduce significant porosity into the structure of the deposited film. Porosity in the deposited film can further lower the dielectric constant. In some embodiments, the porosity of the deposited silicon carbide film is between about 20% and 50%. The pore size of porous film may track that of the cyclic or caged precursor. In certain embodiments, the film's average pore size is between about 5 Å and 20 Å, such as about 16 Å.

Apparatus

One aspect of the disclosure is an apparatus configured to accomplish the methods described herein. A suitable apparatus includes hardware for accomplishing the process operations and a system controller having instructions for controlling process operations in accordance with the present disclosure. In some embodiments, the apparatus for performing the aforementioned process operations can include a remote plasma source. A remote plasma source provides mild reaction conditions in comparison to a direct plasma. An example of a suitable remote plasma apparatus is described in U.S. patent application Ser. No. 14/062,648, filed Oct. 24, 2013, which is incorporated herein by reference in its entirety.

Figure 3:
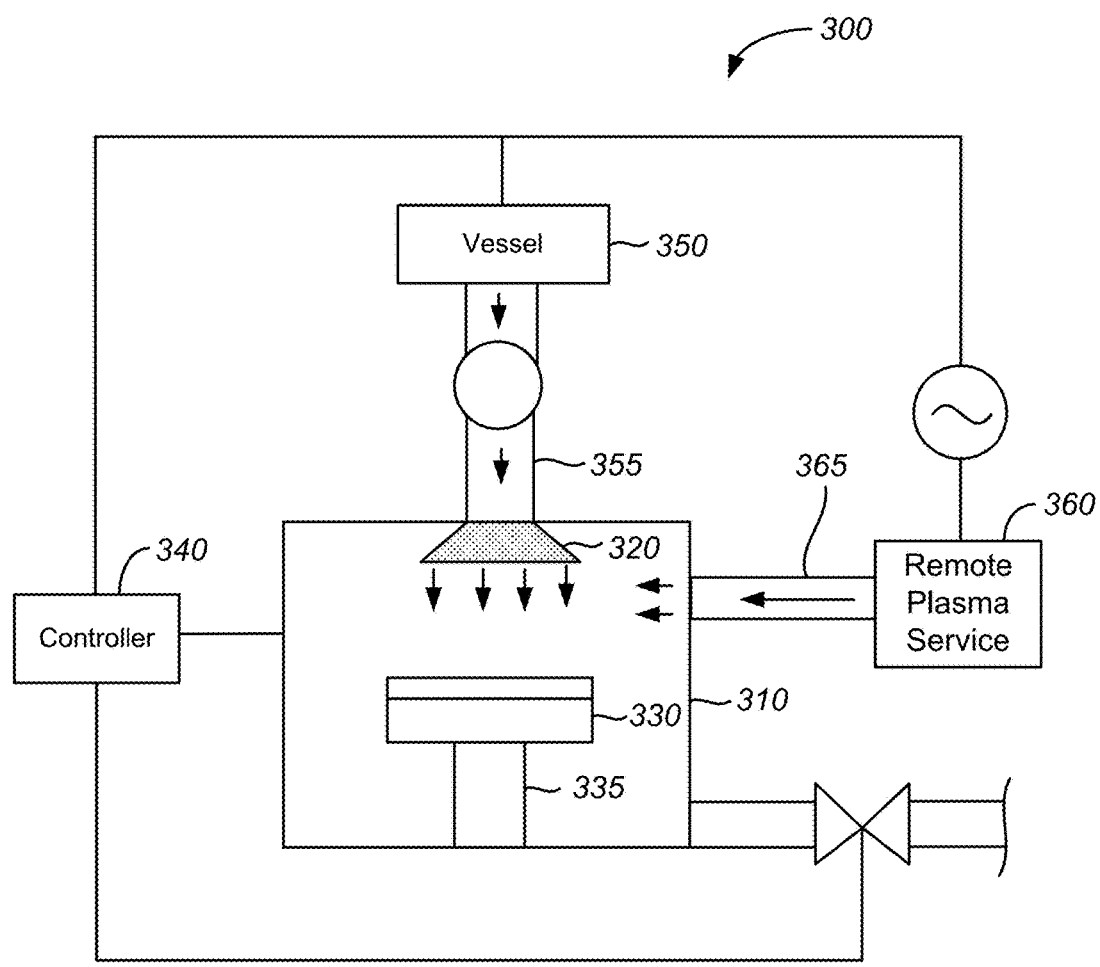
FIG. 3 illustrates a schematic view of a processing apparatus with a remote plasma source.

FIG. 3 presents a schematic diagram of a remote plasma apparatus according to certain embodiments. The device 300 includes a reaction chamber 310 with a showerhead assembly 320. Inside the reaction chamber 310, a substrate 330 rests on a stage or pedestal 335. In some embodiments, the pedestal 335 can be fitted with a heating/cooling element. A controller 340 may be connected to the components of the device 300 to control the operation of the device 300. For example, the controller 340 may contain instructions or controlling process conditions for the operations of the device 300, such as the temperature process conditions and/or the pressure process conditions.

During operation, gases or gas mixtures are introduced into the reaction chamber 310 via one or more gas inlets coupled to the reaction chamber 310. In some embodiments, two or more gas inlets are coupled to the reaction chamber 310. A first gas inlet 355 can be coupled to the reaction chamber 310 and connected to a vessel 350, and a second gas inlet 365 can be coupled to the reaction chamber 310 and connected to a remote plasma source 360. In embodiments including remote plasma configurations, the delivery lines for the precursors and the radical species generated in the remote plasma source are separated. Hence, the precursors and the radical species do not substantially interact before reaching the substrate 330.

One or more radical species may be generated in the remote plasma source 360 and configured to enter the reaction chamber 310 via the gas inlet 365. Any type of plasma source may be used in remote plasma source 360 to create the radical species. This includes, but is not limited to, capacitively coupled plasmas, inductively coupled plasmas, microwave plasmas, DC plasmas, and laser-created plasmas. An example of a capacitively coupled plasma can be a radio frequency (RF) plasma. A high-frequency plasma can be configured to operate at 13.56 MHz or higher. An example of such a remote plasma source 360 can be the GAMMA®, manufactured by Novellus Systems of San Jose, Calif.

Another example of such a RF remote plasma source 360 can be the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used as the remote plasma source 360, such as the Astex®, also manufactured by MKS Instruments. A microwave plasma can be configured to operate at a frequency of 2.45 GHz. Gas provided to the remote plasma source may include hydrogen, nitrogen, oxygen, and other gases as mentioned elsewhere herein. In certain embodiments, hydrogen is provided in a carrier such helium. As an example, hydrogen gas may be provided in a helium carrier at a concentration of about 1-10% hydrogen.

The precursors can be provided in vessel 350 and can be supplied to the showerhead 320 via the first gas inlet 355. The showerhead 320 distributes the precursors into the reaction chamber 310 toward the substrate 330. The substrate 330 can be located beneath the showerhead 320. It will be appreciated that the showerhead 320 can have any suitable shape, and may have any number and arrangement of ports for distributing gases to the substrate 330. The precursors can be supplied to the showerhead 320 and ultimately to the substrate 330 at a controlled flow rate.

The one or more radical species formed in the remote plasma source 360 can be carried in the gas phase toward the substrate 330. The one or more radical species can flow through a second gas inlet 365 into the reaction chamber 310. It will be understood that the second gas inlet 365 need not be transverse to the surface of the substrate 330 as illustrated in FIG. 3. In certain embodiments, the second gas inlet 365 can be directly above the substrate 330 or in other locations. The distance between the remote plasma source 360 and the reaction chamber 310 can be configured to provide mild reactive conditions such that the ionized species generated in the remote plasma source 360 are substantially neutralized, but at least some radical species in substantially low energy states remain in the environment adjacent to the substrate 330. Such low energy state radical species are not recombined to form stable compounds. The distance between the remote plasma source 360 and the reaction chamber 310 can be a function of the aggressiveness of the plasma (e.g., determined in part by the source RF power level), the density of gas in the plasma (e.g., if there's a high concentration of hydrogen atoms, a significant fraction of them may recombine to form $H_2$ before reaching the reaction chamber 310), and other factors. In some embodiments, the distance between the remote plasma source 360 and the reaction chamber 310 can be between about 1 cm and 30 cm, such as about 5 cm or about 15 cm.

In some embodiments, a co-reactant, which is not the primary silicon-containing precursor or a hydrogen radical, may be introduced during the deposition reaction. In some implementations, the apparatus is configured to introduce the co-reactant through the second gas inlet 365, in which case the co-reactant is at least partially converted to plasma. In some implementations, the apparatus is configured to introduce the co-reactant through the showerhead 320 via the first gas inlet 355. Examples of the co-reactant include oxygen, nitrogen, carbon dioxide, and the like.

The controller 340 may contain instructions for controlling process conditions for the operation of the device 300. The controller 340 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 340 or they may be provided over a network.

In certain embodiments, the controller 340 controls all or most activities of the semiconductor processing device 300 described herein. For example, the controller 340 may control all or most activities of the semiconductor processing device 300 associated with depositing a silicon carbide film and, optionally, other operations in a fabrication flow that includes the silicon carbide films. The controller 340 may execute system control software including sets of instructions for controlling the timing, gas composition, gas flow rates, chamber pressure, chamber temperature, RF power levels, substrate position, and/or other parameters. Other computer programs, scripts, or routines stored on memory devices associated with the controller 340 may be employed in some embodiments. To provide relatively mild reactive conditions at the environment adjacent to the substrate 330, parameters such as the RF power levels, gas flow rate to the remote plasma region, and timing of the plasma ignition can be adjusted and maintained by controller 340. Additionally, adjusting the substrate position may further reduce the presence of high-energy radical species at the environment adjacent to the substrate 330. In a multi-station reactor, the controller 340 may comprise different or identical instructions for different apparatus stations, thus allowing the apparatus stations to operate either independently or synchronously.

In some embodiments, the controller 340 may include instructions for performing operations such as flowing a silicon-containing precursor through the first gas inlet 355 into the reaction chamber 310, providing the one or more radical species in a substantially low energy state from the remote plasma source 360, and flowing the one or more radical species through the second gas inlet 365 into the reaction chamber 310 to react with the silicon-containing precursor to form the silicon carbide film on the substrate 330.

In some embodiments, the apparatus may include a user interface associated with controller 340. The user interface may include a display screen, graphical software displays of the apparatus and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

In general, the methods described herein can be performed on systems including semiconductor processing equipment such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. In general, the electronics are referred to as the controller, which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon carbide), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In addition to the silicon carbide deposition described herein, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Applications

The present disclosure may be further understood by reference to the following applications for high-quality silicon carbide films, which applications are intended to be purely exemplary. The present disclosure is not limited in scope by the specified applications, which are simply illustrations of aspects of the disclosure.

In some embodiments, a silicon carbide film may be deposited over exposed copper. In depositing the silicon carbide film, reaction conditions adjacent to the substrate can be free of oxidants, such as $O_2$, $O_3$, and $CO_2$, including radicals thereof. Thus, the silicon carbide film may be deposited directly over the exposed copper without oxidizing copper (e.g., creating cupric oxide). Such films can serve as etch stop layers, which can also serve as copper diffusion barriers. The presence of the silicon carbide film can provide a sufficiently low dielectric constant with excellent leakage properties to serve as a diffusion barrier. The silicon carbide film can be an etch stop and/or diffusion barrier either by itself or as a bilayer stack (e.g., silicon carbide/SiNC bilayer deposited over exposed copper). In some embodiments, the silicon carbide film can be placed in between adjacent metallization layers that are typically produced by a damascene process. The silicon carbide film can resist etching and can be sufficiently dense to minimize the diffusion of copper ions into adjacent regions of dielectric material. In some embodiments, the precursor employed for the silicon carbide film can be non-cyclic. Non-cyclic precursors can include PMDSO or TMDSO. The non-cyclic precursor can provide a sufficiently high density to serve as a hermetic or diffusion barrier. In some embodiments, nitrogen may be incorporated into the film by employing nitrogen-containing precursors or plasma activating nitrogen-containing radicals, such as elemental nitrogen radicals or amine radicals.

In some embodiments, a silicon carbide film may be deposited as vertical structures adjacent to metal or semiconductor structures. Deposition of silicon carbide provides excellent step coverage along sidewalls of the metal or semiconductor structures to create the vertical structures. In certain embodiments, the vertical structures may be referred to as spacers or liners. FIG. 1B illustrates a cross-section of silicon carbide liners deposited on the sidewalls of a gate electrode structure of a transistor. As illustrated in FIG. 1B, the transistor can be a CMOS transistor with a silicon substrate 110 having a source 112 and a drain 113. A gate dielectric 114 can be deposited over the silicon substrate 110, and a gate electrode can be deposited over the gate dielectric 115 to form the transistor. Silicon carbide liners 111 can be deposited on the sidewalls of the gate electrode 115 and gate dielectric 114. In another example, FIG. 1C illustrates a cross-section of silicon carbide deposited on sidewalls of exposed copper lines in an air gap type metallization layer. Air gaps 120 can be introduced into an integrated circuit layer between copper lines 122 that can reduce the effective k-value of the layer. Silicon carbide liners 121 can be deposited on the sidewalls of the copper lines 122, and a nonconformal dielectric layer 123 can be deposited the air gaps 120, liners 121, and copper lines 122. Examples of such air gap type metallization layers can be described in U.S. Patent Publication No. 2004/0232552 to Fei Wang et al., which is herein incorporated by reference.

In some embodiments, a silicon carbide film may be deposited on the sidewalls of patterned porous dielectric materials. Ultra low-k dielectric materials can be made from a porous structure. The pores in such materials can provide areas for ingress of metal during deposition of subsequent layers, including the deposition of diffusion barriers containing a metal such as tantalum (Ta). If too much metal migrates into the dielectric material, the dielectric material may provide a short circuit between adjacent copper metallization lines. FIG. 1D illustrates a cross-section of silicon carbide as a pore sealant for porous dielectric materials. A porous dielectric layer 132 can have a plurality of trenches or vias cut into the porous dielectric layer 132 to form pores 130. Silicon carbide 131 can be deposited along the pores 130 to effectively seal the pores 130. Sealing the pores 130 with the silicon carbide 131 can avoid damaging the porous dielectric layer 132 that may otherwise be incurred by other sealing techniques using a plasma. The silicon carbide 131 can be sufficiently dense as a pore sealant and may include non-cyclic silicon-containing precursors, such as PMDSO and TMDSO. In some embodiments, an etched dielectric material such as the porous dielectric layer 132 may first be treated by a "k-recovery" process, which exposes the porous dielectric layer 132 to UV radiation and a reducing agent. This recovery process is further described in commonly owned U.S. Patent Publication No. 2011/0111533 to Varadarajan et al., which is incorporated by reference herein for all purposes. In another "k-recovery" process, the porous dielectric layer 132 can be exposed to UV radiation and a chemical silylating agent. This recovery process is further described in commonly owned U.S. Patent Publication No. 2011/0117678 to Varadarajan et al., which is incorporated by reference herein for all purposes. After exposing the pores 130 to the recovery treatment, which makes the surface more hydrophilic and provides a monolayer of material, a layer of conformally deposited silicon carbide 131 can be deposited to effectively seal the pores of the porous dielectric layer 132.

In some embodiments, a silicon carbide film may be deposited as an ultra low-k dielectric material itself. Ultra low-k dielectrics are conventionally defined as those materials that have a dielectric constant lower than that of 2.5. In such configurations, the ultra low-k dielectric material of silicon carbide can be a porous dielectric layer. The pores of the dielectric layer can be introduced by using cyclic or caged precursor molecules, including the cyclic siloxanes and silsesquioxanes. In one example, the porosity of the ultra low-k dielectric layer of silicon carbide can be between about 20% and 50%. Further, the ultra low-k dielectric layer can have an average pore size of less than about 100 Å, such as between about 5 Å and 20 Å. For example, a cyclosiloxane ring can have a radius of about 6.7 Å. While increasing the number and size of the pores can lower the dielectric constant, the mechanical integrity of the dielectric layer can be compromised if it is too porous.

Example

Figure 4:
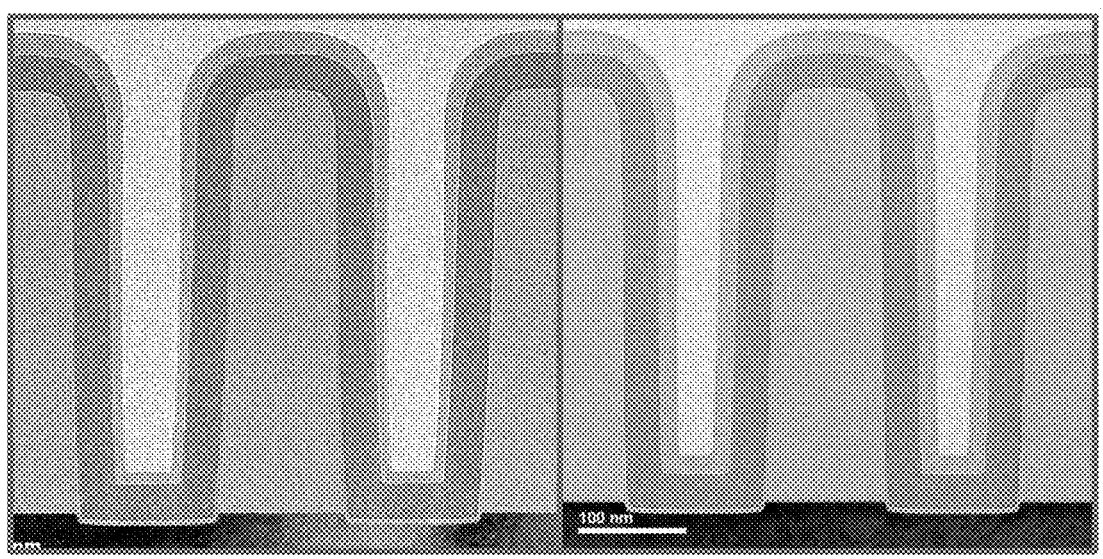
FIG. 4 presents two micrographs comparing features having oxygen doped silicon carbide produced under similar conditions but employing two different precursors, one containing an alkoxy group and the other without an alkoxy group.

FIG. 4 presents a scanning electron micrograph of two oxygen doped silicon carbide films: the one on the left was deposited using a precursor with an alkoxy group and the one on the right was deposited using a similar precursor, but without an alkoxy group. Other than the precursor differences, the apparatus and deposition conditions were identical. The feature on which the films were deposited had an aspect ratio of 7:1 and a width of about 60 nm. As shown, the conformality of the film produced using the alkoxy-containing precursor was about 55% and the film produced using the alkoxy-free precursor was about 75%.

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of depositing a silicon carbide film on a substrate, the method comprising:
   (a) providing the substrate to a reaction chamber;
   (b) flowing one or more silicon-containing precursors to the substrate, wherein each of the one or more silicon-containing precursors have (i) one or more silicon-hydrogen bonds and/or silicon-silicon bonds, (ii) one or more silicon-carbon bonds, silicon-nitrogen bonds, and/or silicon-oxygen bonds, (iii) no carbon-oxygen bonds, and (iv) no carbon-nitrogen bonds;
   (c) flowing a source gas into a plasma source;
   (d) generating, from the source gas, radicals of hydrogen in the plasma source;
   (e) flowing the radicals of hydrogen onto the substrate, wherein all or at least 90% of the radicals are radicals of hydrogen in the ground state that react with the one or more silicon-containing precursors under conditions that break the silicon-containing precursor's silicon-hydrogen bonds or silicon-silicon bonds but preserve the silicon-containing precursor's silicon-carbon bonds, silicon-nitrogen bonds, and/or silicon-oxygen bonds; and
   (f) forming, from the reaction, a silicon oxycarbide (SiOC) film, silicon nitricarbide (SiNC) film, or silicon oxynitricarbide (SiONC) film on the substrate, wherein the one or more silicon-containing precursors include an alkylcarbosilane, a siloxane, a silazane, or any combination thereof when forming SiOC film, SiNC film, or SiONC film, wherein the SiOC film, SiNC film, or SiONC film has a conformality of at least 90%.

2. The method of claim 1, further comprising flowing a co-reactant with the one or more silicon-containing precursors, wherein the co-reactant includes at least one of carbon dioxide, carbon monoxide, water, methanol, oxygen, ozone, nitrogen, nitrous oxide, ammonia, methane, ethane, acetylene, ethylene, and diborane.

3. The method of claim 2, wherein the co-reactant includes one or both of carbon dioxide and oxygen.

4. The method of claim 1, wherein the silicon oxycarbide film, silicon nitricarbide film, or silicon oxynitricarbide film is formed without performing atomic layer deposition.

5. The method of claim 1, wherein the one or more silicon containing precursors have no alkoxy groups (—C—O—R), where R is an organic moiety, and no amine groups (—C—NR1R2), where R1 and R2 are each independently hydrogen or an organic moiety.

6. The method of claim 1, wherein the one or more silicon-containing precursors include a cyclic siloxane.

7. The method of claim 6, wherein the cyclic siloxane is selected from the group consisting of heptamethylcyclotetrasiloxane and tetramethylcyclotetrasiloxane.

8. The method of claim 1, wherein the one or more silicon containing precursors include a linear siloxane.

9. The method of claim 8, wherein the linear siloxane is selected from the group consisting of disiloxanes and trisiloxanes.

10. The method of claim 1, wherein the one or more silicon-containing precursors include an alkyl silane.

11. The method of claim 1, wherein the one or more silicon-containing precursors include a silazane.

12. The method of claim 1, wherein during (b) through (e), no compound containing a carbon-oxygen bond or a carbon-nitrogen bond is provided to the substrate.

13. The method of claim 1, wherein generating the radicals of hydrogen comprises exposing the source gas to a remote plasma.

14. The method of claim 13, further comprising producing the remote plasma from an RF power source or a microwave power source.

15. The method of claim 1, wherein the ratio of silicon-oxygen or silicon-nitrogen bonds to silicon-carbon bonds in the silicon oxycarbide film, the silicon nitricarbide film, or the silicon oxynitricarbide film is between 3:1 and 0.5:1.

16. The method of claim 1, wherein the substrate comprises a transistor having a gate electrode, the method further comprising forming the silicon oxycarbide film, the silicon nitricarbide film, or the silicon oxynitricarbide film on one or more sidewalls of the gate electrode.

17. The method of claim 1, wherein the silicon oxycarbide film, the silicon nitricarbide film, or the silicon oxynitricarbide film comprises an ultralow-k dielectric thin film.

* * * * *